United States Patent
Leung et al.

(10) Patent No.: US 11,290,396 B1
(45) Date of Patent: Mar. 29, 2022

(54) DYNAMIC DETERMINATION OF PARITY PACKETS FOR DATA TRANSMISSIONS

(71) Applicant: Amazon Technologies, Inc., Seattle, WA (US)

(72) Inventors: Hok Peng Leung, Woodinville, WA (US); Prasad Vyawahare, Bellevue, WA (US)

(73) Assignee: Amazon Technologies, Inc., Seattle, WA (US)

( * ) Notice: Subject to any disclaimer, the term of this patent is extended or adjusted under 35 U.S.C. 154(b) by 151 days.

(21) Appl. No.: 16/835,114

(22) Filed: Mar. 30, 2020

(51) Int. Cl.
| | |
|---|---|
| *H04L 12/939* | (2013.01) |
| *H04L 49/55* | (2022.01) |
| *H04L 43/0829* | (2022.01) |
| *G06N 20/00* | (2019.01) |
| *H04L 67/303* | (2022.01) |
| *H04L 41/082* | (2022.01) |
| *H03M 13/11* | (2006.01) |
| *H04L 43/065* | (2022.01) |

(52) U.S. Cl.
CPC .......... *H04L 49/555* (2013.01); *G06N 20/00* (2019.01); *H03M 13/1102* (2013.01); *H04L 41/082* (2013.01); *H04L 43/065* (2013.01); *H04L 43/0829* (2013.01); *H04L 49/557* (2013.01); *H04L 67/303* (2013.01)

(58) Field of Classification Search
CPC ... H04L 49/555; H04L 41/082; H04L 43/065; H04L 43/0829; H04L 49/557; H04L 67/303; G06N 20/00; H03M 13/1102
See application file for complete search history.

(56) References Cited

U.S. PATENT DOCUMENTS

| | | | |
|---|---|---|---|
| 11,156,998 B2 * | 10/2021 | Cella | G05B 19/41875 |
| 11,159,408 B2 * | 10/2021 | Svennebring | H04L 43/0882 |
| 2021/0306993 A1 * | 9/2021 | Raza | H04W 28/16 |

\* cited by examiner

*Primary Examiner* — Jae Y Lee
*Assistant Examiner* — Aixa A Guadalupe Cruz
(74) *Attorney, Agent, or Firm* — Davis Wright Tremaine LLP

(57) ABSTRACT

Technology is described for receiving a request for data packets at a server from a device. The server may determine a predicted number of data packets that are expected to be lost during fulfillment of the request based in part on a device profile. The server may send, in response to the request, the requested data packets and parity packets to the device. The number of parity packets may be based on the predicted number of data packets. The parity packets may enable the device to rebuild requested data packets that are lost during fulfillment of the request.

20 Claims, 10 Drawing Sheets

Time1: 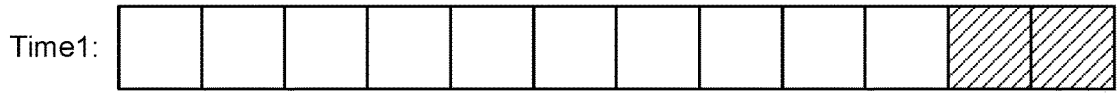

First packet request is for 10 data packets;
10 data packets and 2 parity packets are sent based on device profile;
Device receives all 10 data packets Time2: 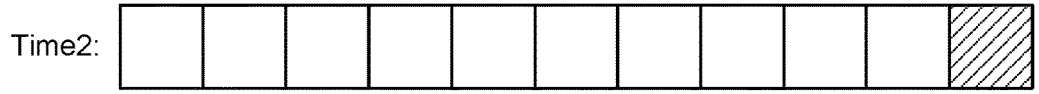

Second packet request (including packet error information) is for 10 data packets;
10 data packets and 1 parity packet is sent;
Device receives 9 data packets and rebuilds one lost data packet Time3: 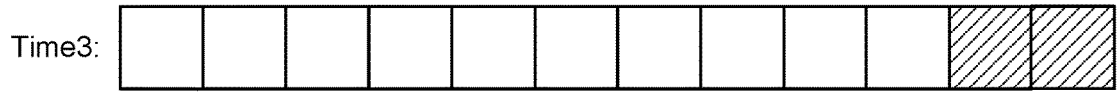

Third packet request (including packet error information) is for 10 data packets;
10 data packets and 2 parity packets are sent;
Device receives 7 data packets and rebuilds two lost data packets; goes to timeout Time4: 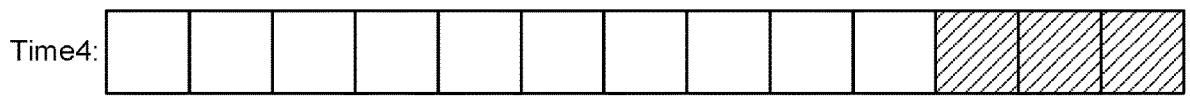

Fourth packet request (includes packet error information) is for 10 data packets;
10 data packets and 3 parity packets are sent;

FIG. 5

DYNAMIC DETERMINATION OF PARITY PACKETS FOR DATA TRANSMISSIONS

BACKGROUND

Over-the-air (OTA) distribution or updates may refer to various techniques for distributing updated software, firmware, configuration settings, encryption keys, etc. to devices, such as mobile phones, set-top boxes, industrial machinery, industrial sensors, home automation devices, and Internet of Things (IoT) devices. OTA updates may occur automatically or as initiated by an administrator or user (e.g., manually) depending on a device type or settings. For example, devices which are in remote locations, such as IoT sensors, or devices, which do not have frequency human contact, may periodically receive automatic OTA updates. With respect to manual OTA updates, a user associated with a device may be notified about an available update, and the user may manually accept or refuse to download the update on the device.

In one example, OTA updates may be an efficient mechanism for fixing software bugs and updating software, as opposed to manually upgrading individual devices. Further, OTA updates may allow a relatively large number of devices to be updated from a central location. For example, in the case of automatic OTA updates, a central server may send the update to the devices and the update may be automatically installed on the devices.

BRIEF DESCRIPTION OF THE DRAWINGS

FIG. 5 is an illustration of an adjustment to a number of requested data packets and parity packets that are sent over a period of time based on packet error information according to an example of the present technology.

DETAILED DESCRIPTION

Figure 1:
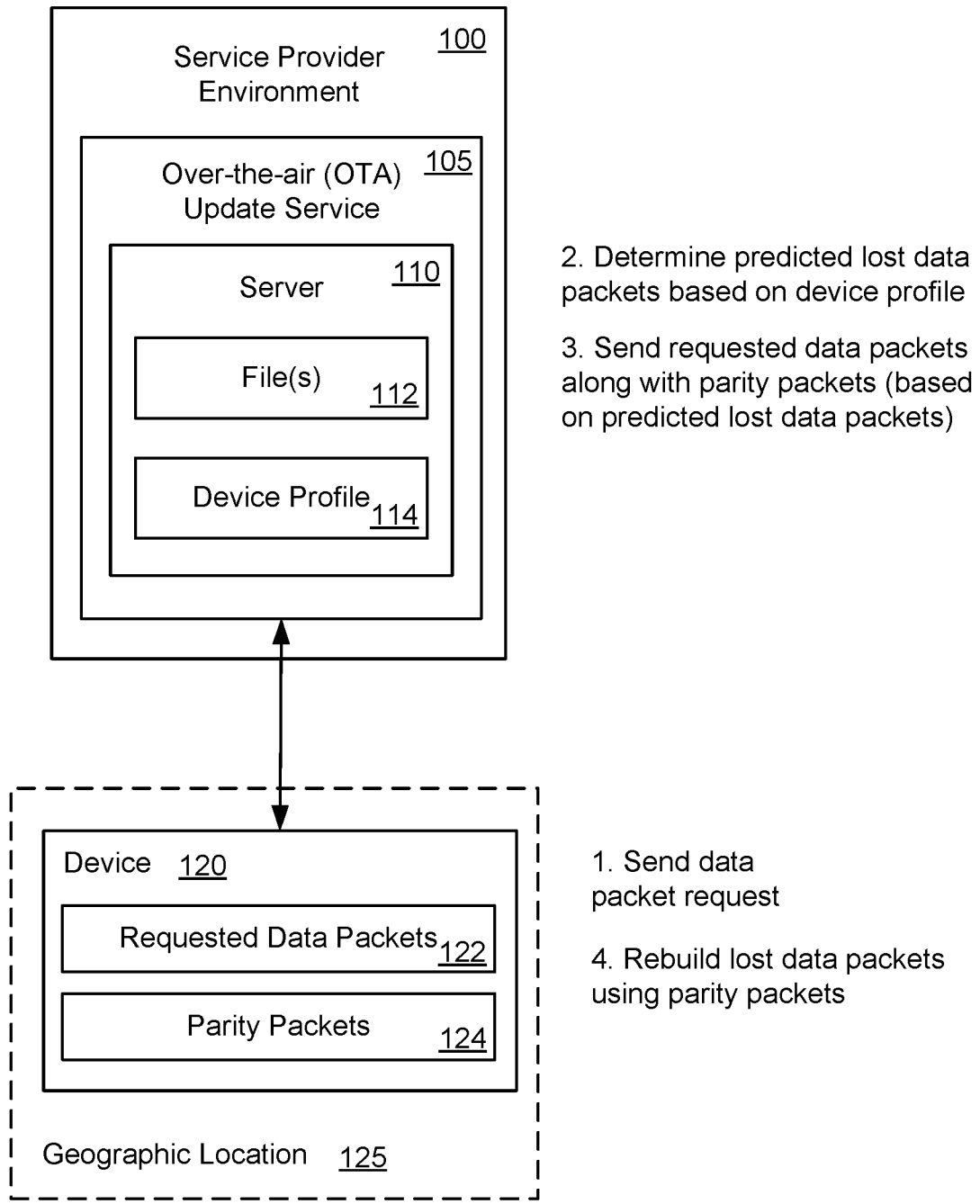
FIG. 1 illustrates a system and related operations for sending requested data packets and parity packets to a device based on a predicted number of data packets that are expected to be lost during transmission from a server to the device according to an example of the present technology.

Technologies are described for predicting a number of data packets that are expected to be lost during transmission of the data packets in a wireless update and sending parity packets in anticipation of the number of lost data packets. For example, a server may receive a request for packets from a device, such as an Internet of Things (IoT) device. The device may be located or installed in a geographic location or network location having poor connectivity or intermittent connectivity issues. For example, the device may be located or installed on a farm, a moving platform such as a truck, in a factory, or another area that is prone to data loss. The requested data packets may be sub-parts of a file that are being downloaded to the device as an over-the-air (OTA) update (e.g., via Wi-Fi, Bluetooth®, or another wireless protocol). The server may predict the number of data packets that are expected to be lost during transmission based on a device profile associated with the device. The device profile may include hardware components, hardware features of the device, a geographic location of the device and a level of connectivity associated with the geographic location, a type of network connection used by the device, a historical percentage of lost data packets per request, etc. The server may send the requested data packets to the device as well as parity packets based on the predicted number of data packets that are expected to be lost. The device may use the parity packets (e.g., low-density parity-check (LDPC) codes) to rebuild requested data packets that are lost. In addition, the device may send packet error information back to the server in a subsequent request for data packets. Based on the packet error information, the server may adjust the predicted number of data packets that are expected to be lost during the next transmission.

In one example, in response to the request received for the data packets, the server may determine a predicted number of data packets that are expected to be lost during fulfillment of the request based on the device profile. For example, the server may predict the number of data packets that are expected to be lost based on the geographic location associated with the device, a level of connectivity associated with the geographic location and/or numerical feedback from the client device. For example, certain geographic locations may be prone to having poorer connectivity, and in this case, an increased number of dropped data packets may be expected. The server may also predict the number of data packets that are expected to be lost based on the historical percentage of lost data packets per request for the device. In this case, the historical percentage of lost data packets may be device specific. Further, the server may predict the number of data packets that are expected to be lost based on the packet loss information for devices located in physical proximity to the device. For example, if a proximately located device has favorable connectivity, then the server may assume that the device requesting the data packets may also have favorable connectivity. On the other hand, if a proximately located device is known to have poor connectivity and data packets are frequently dropped, then the server may assume that the device requesting the data packets may have similar issues. In addition, the server may predict the number of data packets based on hardware features of the device such as a processor type or a memory type, a type of network connection used by the device, a device type, a current battery level for the device, an indicator of whether the device is plugged into a power source or another device attribute.

The server may transmit the requested data packets to the device, as well as parity packets, where a number of parity packets transmitted by the server may be based on the predicted number of data packets that are expected to be lost during transmission of the requested data packets to the device. The requested data packets and the parity packets may be transmitted together in a single transmission to the device. The parity packets may be redundant data packets which enable the device to rebuild or recover requested data packets that are lost during fulfillment of the request. For example, the parity packets may be LDPC packets. Alternatively, the parity packets may use another form of error correction code, which may include but are not limited to, a convolutional code, a Hadamard code, a Hamming code, a Reed-Solomon code, a turbo code, a Walsh-Hadamard code, cyclic redundancy checks (CRCs), etc. In one example, the device may use one parity packet to rebuild or recover one data packet that was lost during transmission. In other examples, the device may use two parity packets to recover one data packet, or the device may use one parity packet to recover two data packets. The parity packet(s) may be used to rebuild any data packet(s) that were dropped in a group of data packets transmitted to the device, whether the lost data packets were in the beginning, middle or end of the group of data packets sent from the server to the device. Therefore, the parity packets may be sent preemptively to the device in anticipation of the device losing some data packets that are transmitted by the server, and the parity packets may allow the device to rebuild and effectively recover the lost data packets.

As a non-limiting example, the device may request ten data packets from the server. Based on a device profile associated with the device, the server may determine that the device is likely to drop two data packets out of the ten data packets. In this example, the server may send the ten data packets as well as two parity packets to the device. In a first scenario, the device may successfully receive all ten data packets, and in this case, the device may store the two parity packets for later use. In a second scenario, the device may receive eight data packets out of the ten data packets and the two parity packets. In this case, the device may rebuild the two lost data packets using the two parity packets. In a third scenario, the device may receive five data packets out of the ten data packets and the two parity packets. In this case, the device may rebuild two of the lost data packets using the two parity packets, but may be unable to recover the three lost data packets. Further, in this case, the device may wait for a timeout period to expire before making an additional request for data packets.

In one example, the device may send packet error information to the server after receiving the data packets from the server. For example, the packet error information may indicate a number or percentage of data packets that were successfully received in response to the request. The device may send the packet error information in a subsequent request for data packets. The server may receive the subsequent request and based on the packet error information, the server may adjust the predicted number of data packets that are expected to be lost during transmission. For example, the server may increase the predicted number of data packets, decrease the predicted number of data packets or maintain the predicted number of data packets based on the packet error information.

In one example, the server may assign a default predicted number of data packets that are expected to be lost during fulfillment of the request. In other words, the predicted number of data packets may be assigned a default value. The default value (e.g., two parity packets per request) may be assigned based on an instruction received from a customer or an administrator. The server may adjust the predicted number of data packets to be different from the default value (e.g., higher than the default value, lower than the default value or same as the default value) based on the packet error information that is received from the device.

FIG. 1 illustrates an example of a system and related operations for sending requested data packets 122 and parity packets 124 to a device 120 (e.g., an IoT device) based on a predicted number of data packets that are expected to be lost during transmission from a server 110 to the device 120. The device 120 may be an IoT device and the server 110 may be included in an OTA update service 105 that operates in a service provider environment 100. The device 120 may be located in a geographic location 125 having poor connectivity or intermittent connectivity problems.

The device 120 may send a data packet request to the server 110. For example, the data packet request may include a portion of a file 112 to be downloaded from the server 110 as part of an OTA update. In general, based on a size of the data packet request, the server 110 may divide the file 112 into portions or chunks of data, and then send the portion of the file 112 to the device 120 in response to the device request. However, it may take several packet requests to receive a single portion or chunk of a file. Once a given data packet request is received from the server 110, the device 120 may send another data packet request to the server 110, and so on. The individual data packet requests may not necessarily align with the chunks of data into which the file 112 is divided.

The server 110 may determine a predicted number of data packets that are expected to be lost during transmission of the requested data packets 122 to the device 120. The server 110 may determine the predicted number of data packets to be lost using a device profile 114 associated with the device 120, where the device profile 114 may be stored on the server 110. The device profile 114 may describe various features of the device 120 or attributes relate to the device 120. For example, the device profile 114 may include a device type, a memory type for the device 120, a processor type for the device 120, a current battery level for the device 120, an indicator of whether the device 120 is plugged into a power source, the geographic location 125 of the device 120 and a level of connectivity associated with the geographic location 125, a type of network connection used by the device 120, a historical percentage of lost data packets per request and/or packet loss information for devices located in physical proximity to the device 120 (e.g., other devices at the same geographic location 125 of the device 120). Therefore, based on the device profile 114, the server 110 may estimate the number of data packets that are expected to be lost when fulfilling the data packet request.

In one example, the device profile 114 associated with the device 120 may be updated based on changes made to the device 120. For example, if the device 120 moves from a first geographic location to a second geographic location, the device profile 114 may be updated to include the second geographic location. Thus, the server 110 may receive updated device information from the device 120 (e.g., when the device 120 moves between geographic locations), and the server 110 may update the device profile 114 associated with the device 120 based on the updated device information received from the device 120.

The server 110 may send the requested data packets 122 to the device 120. The server 110 may also send the parity packets 124 to the device 120, where a number of parity packets 124 may correspond to the predicted number of data packets that are expected to be lost during transmission of the requested data packets 122. The requested data packets 122 and the parity packets 124 may be transmitted together in a single transmission to the device 120. The parity packets 124 may include data for parity matrices, entropy blocks, error correction code (ECC) blocks, etc. For example, the server 110 may send two parity packets or three parity packets when two data packets are predicted to be lost during transmission of the requested data packets 122. The parity packets 124 may be LDPC packets. Alternatively, the parity packets 124 may use another form of error correction code, which may include but is not limited to, convolutional code, Hadamard code, Hamming code, Reed-Solomon code, turbo code, Walsh-Hadamard code, cyclic redundancy checks (CRCs), etc.

The device 120 may rebuild or recover the requested data packets 122 that were lost during transmission from the server 110 to the device 120 using the parity packets 124. In other words, the parity packets 124 may provide the device 120 with additional information, which may enable the device 120 to recover any of the requested data packets 122 that were lost during transmission from the server 110 to the device 120. Parity packet(s) may be used to recover lost data packet(s), irrespective of whether the lost data packet(s) were at a beginning, middle or end of the requested data packets being transmitted to the device 120. When the server 110 accurately calculates the predicted number of data packets that are expected to be lost, requested data packets 122 that are lost during transmission may be fully recovered by the device 120 using the parity packets 124. The device 120 may rebuild the lost data packets and send another request for data packets to the server 110. On the other hand, when the server 110 underestimates the number of data packets that are expected to be lost, the requested data packets 122 that are lost during a transmission may be partially recovered. In this case, the device 120 may wait until a timeout period expires to determine if the needed packet arrive before the timeout period before sending another request for data packets to the server 110.

In one example, IoT devices may be installed in remote locations and may suffer from intermittent connectivity. During these times, the IoT devices may not be able to receive data from servers or may receive data at a reduced bitrate. As a result, an OTA update for the IoT devices may take an extended period of time. As an example, an OTA update may involve downloading a file that is one megabyte (MB), which may be approximately 1000 data packets at 1000 bytes per packet. An IoT device may request a portion of the file at a time. In other words, the IoT device may request a first portion of the file, and after receiving the first portion from the server, the IoT device may request a second portion of the file. This process may continue until the entire file is transmitted to the IoT device.

For example, the IoT device may request 10 data packets at a time, and a total of 100 requests may be made by the IoT device to download the entire file from the server. In an ideal case, if each request takes two seconds, the entire file may be downloaded to the IoT device in 200 seconds. In the case where the IoT device suffers from intermittent connectivity, this process may take an increased amount of time. For example, in past configurations, the IoT device may request 10 data packets at a time, but may actually receive 9 data packets from the server. Since the number of data packets received is not equal to the number of data packets that is requested, the IoT device may receive the 9 data packets and then enter a timeout period during which the IoT device is unable to send another request until the timeout period expires. A non-limiting example of the timeout period may be 16 seconds. In this example, for a given request, the IoT device may receive the 9 data packets in 16 seconds, and then the IoT device may re-request the one lost data packet. However, the IoT device may be unable to send another request until another timeout period of 16 seconds has passed. As a result, a significantly increased amount of time may be needed for each request of 10 data packets to be fulfilled when the connectivity at the IoT device is poor.

In the present technology, the server may preemptively estimate a number of data packets that are expected to be lost per request by the IoT device. The server may calculate the estimated number of data packets that are expected to be lost based on a device profile, which may indicate the geographic location of the IoT device, known connectivity issues or historical data rates at that geographic location, etc. Based on this knowledge, the server may send parity packets as additional information to the IoT device during the fulfillment of each request. The IoT devices may include sufficient battery power and computational power to execute the error correction codes, LDPC decoding, etc. to recover the lost data packets using the parity packets. While sending the parity packets may take additional time as compared to sending no parity packets, the ability to rebuild or recover lost data packets at the device may prevent the device from entering into the timeout period, thereby reducing an overall download latency by reducing the amount of time to fulfill each request when connectivity at the IoT device is poor.

In previous solutions, the server would send exactly the number of data packets requested by the device. For example, of the device requests 10 data packets, the server would attempt to send 10 data packets. If not all 10 data packets were received at the device, the device would enter into a timeout period, and then after expiry of the timeout period, the device could send another request for the lost data packets. In the present technology, the server may intelligently predict how many data packets the device may lose based on various characteristics of the device. Therefore, the device may request 10 data packets from the server, but the server may actually send 12 packets to the device (e.g., 10 data packets and two parity packets). As a result, the device may have the ability to recover or rebuild the lost data packets with the redundant parity packets.

Figure 2:
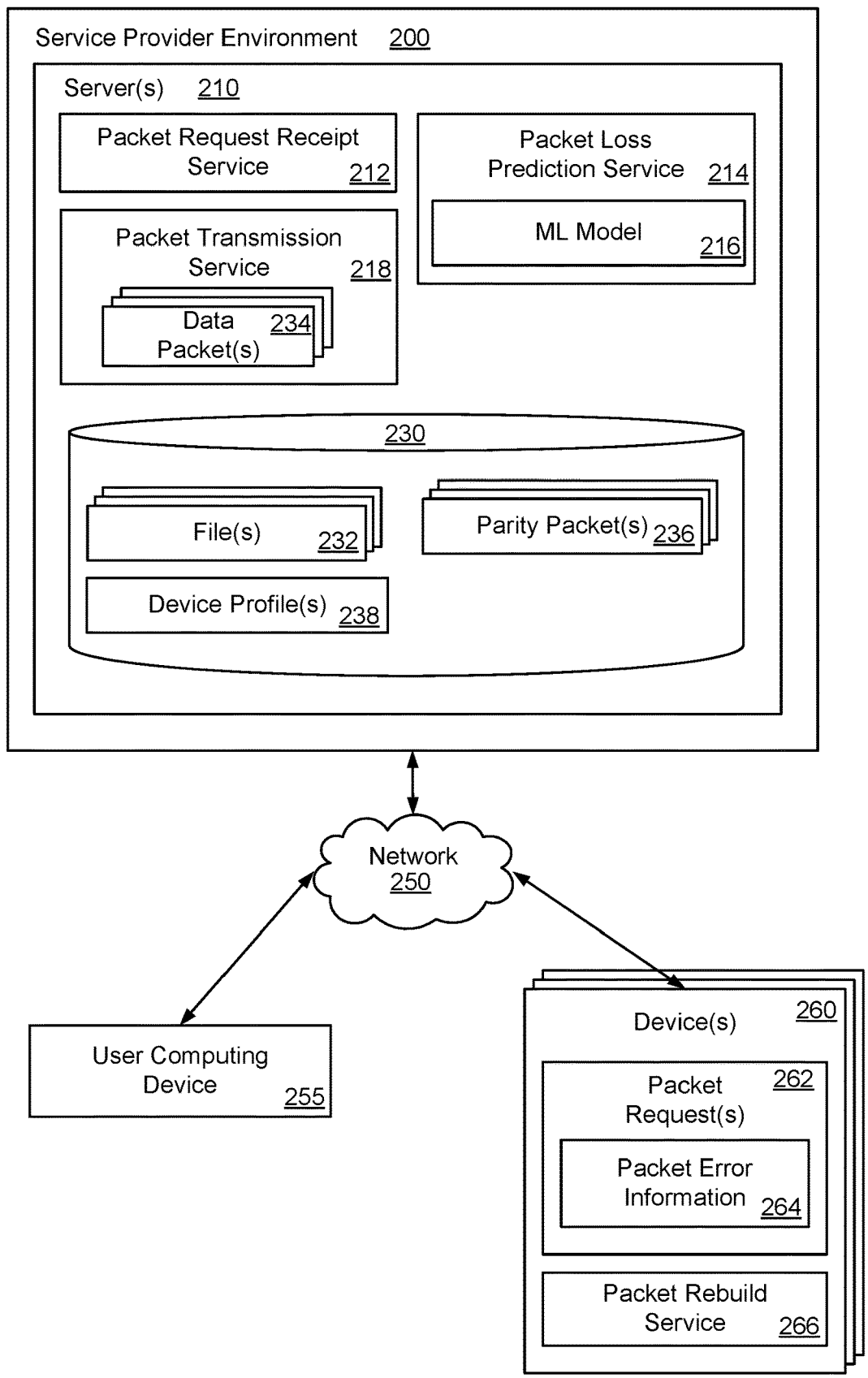
FIG. 2 is an illustration of a networked system for sending requested data packets and parity packets to a device based on a predicted number of data packets that are expected to be lost during transmission from a server to the device according to an example of the present technology.

FIG. 2 illustrates example components of the present technology in a service provider environment 200. The service provider environment 200 may include a server 210 operable to send, in response to a packet request 262, data packets 234 and parity packets 236 to a device 260 (e.g., an IoT device) based on a predicted number of data packets 234 that are expected to be lost during transmission of the data packets 234 from server 210 to the device 260. The server 210 may send the data packets 234 and the parity packets 236 over a network 250 to the device 260, and a number of parity packets 236 that are transmitted to the device 260 may be determined using a device profile 238 associated with the device 260. The device 260 may receive the data packets 234 and the parity packets 236 from the server 210, and if a number of received data packets 234 is less than a number of data packets 234 requested in the packet request 262 (i.e., some data packets 234 were lost during transmission due to connectivity issues at the device 260), the device 260 may use the received parity packets 236 to rebuild the lost data packets 234.

In one example, the server 210 may include a data store 230 that includes file(s) 232. The files 232 may be software, firmware, configuration files or settings, encryption keys, drivers, applications, operating systems (e.g., RTOS), etc. The files 232 may be downloaded and installed on the devices 260 as OTA updates. The files 232 may be updated over time based on software upgrades, security fixes, etc. that are to be pushed down to the devices 260. The files 232, when transmitted to the devices 260, may be broken or divided into data chunks or data segments, and then reassembled and installed on the devices 260.

The data store 230 may include device profiles 238. The device profiles 238 may describe various features, attributes, or characteristics of or related to the devices 260. A given device profile 238 may include a device type or sensor type (e.g., medical device, industrial equipment, farming equipment, environmental sensor, light sensor, etc.) The device profile 238 may include a memory type (e.g., flash memory limited to 1 MB) for the device 260, a processor type for the device 260, a current battery level (e.g., 60% full) for the device 260, an indicator of whether the device 260 is plugged into a power source or is being powered by a battery, etc. Further, the device profile 238 may include a geographic location of the device 260 and a level of connectivity associated with the geographic location. For example, the device profile 238 may indicate whether the geographic location generally has a favorable level of connectivity and a historical data rate that is achieved at that geographical location. The device profile 238 may include a type of network connection used by the device 260, such as WiFi and a wireless frequency range used such as 2.4 GHz or 5 GHz, Bluetooth® or Bluetooth Low Energy (BLE), etc. Further, the device profile 238 may include a historical percentage of lost packets per request for the device 260, as well as packet loss information for devices located in physical proximity to the device 260.

The server 210 may utilize a number of modules for determining the predicted number of data packets 234 that are expected to be lost during transmission and sending the parity packets 236 in anticipation of the lost data packets 234. For example, the server 210 may operate a packet request receipt service 212, a packet loss prediction service 214, a packet transmission service 218, and other applications, modules, services, processes, systems, engines, or functionality not discussed in detail herein.

The packet request receipt service 212 may receive the packet request 262 from the device 260. The packet request receipt service 212 may receive the packet request 262 during an OTA update that is being pushed down to the device 260. The packet request 262 may specify a defined number of data packets 234 that are being requested by the device 260. The number of data packets 234 per request may be a configurable setting on the device 260. For example, the packet request receipt service 212 may receive a packet request for 10 packets or a packet request for 20 packets, depending on the configurable setting on the device 260 and the memory available.

The packet loss prediction service 214 may determine or estimate the number of data packets 234 that are expected to be lost during fulfillment of the packet request 262 based on the device profile 238. In one example, the packet loss prediction service 214 may provide elements or aspects of the device profile 238 as feature inputs to a machine learning model 216. The elements of the device profile 238 may include a geographic location of the device 260 and a level of connectivity associated with the geographic location, a type of network connection used by the device 260, a historical percentage of lost packets per request for the device 260, etc. The packet loss prediction service 214 may predict the number of data packets 234 that are expected to be lost based on an output from the machine learning model 216. The machine learning model 216 may apply feature learning, sparse dictionary learning, anomaly detection, etc. to determine the predicted number of data packets 234. In addition, the machine learning model 216 may incorporate statistical models (e.g., regression), principal component analysis, deep neural networks, or artificial intelligence (AI) in order to determine the predicted number of data packets 234. The machine learning model 216 may be generated using supervised learning, unsupervised learning or reinforcement learning. In another example, the packet loss prediction service 214 may predict the number of data packets 234 that are expected to be lost using heuristic rules, association rules, logic rules, etc.

In one example, the packet loss prediction service 214 may select or generate a number of parity packets 236 based on the predicted number of data packets 234 that are expected to be lost. In one example, the packet loss prediction service 214 may generate the parity packets 236 to be greater than, less than or equal to the predicted number of data packets 234. As an example, if three data packets are predicted to be lost, then three parity packets may be generated. As another example, if two data packets are predicted to be lost, then three parity packets may be generated to provide a margin for error (e.g., a less accurate data packet loss prediction). However, sending an excess number of parity packets 236 (e.g., 20 excess parity packets) may lead to an unnecessary increase in overhead, so the packet loss prediction service 214 may select a reasonable number of parity packets 236 (e.g., one or two extra parity packets) to correct the predicted number of lost data packets 234.

The packet transmission service 218 may transmit, in response to the packet request 262, the requested data packets 234 over the network 250 to the device 260. In addition, the packet transmission service 218 may transmit the parity packets 236 over the network 250 to the device 260, where the number of parity packets 236 may be dependent on the predicted number of data packets 234 that are expected to be lost.

In one configuration, the device 260 may include a packet rebuild service 266. The device 260 may track a number of data packets 234 requested in the packet request 262, as well as a number of data packets 234 actually received in response to the packet request 262. When fewer data packets 234 were actually received at the device 260 compared to the number requested, the packet rebuild service 266 may rebuild or recover the lost data packets 234 using the parity packets 236. The packet rebuild service 266 may have sufficient hardware capability to recover the lost data packets 234, where an amount of computation may depend on the requested number of data packets in relation to the number of parity packets 324. For example, when the device 260 requests ten data packets and receives two parity packets, the process to rebuild two lost data packets using two parity packets may be less computationally intensive as compared to the device 260 requesting 100 data packets and two parity packets and rebuilding two lost data packets using the two parity packets. For example, when the number of requested data packets increase, the level of complexity for the computations may scale up in a quadratic fashion. Therefore, from a computation perspective, the device 260 may benefit from requesting a fewer number of data packets 234 at a time (e.g., 10 data packets per request rather than 100 data packets per request).

In one example, the device 260 may determine packet error information 264 for the packet request 262 that was fulfilled by the server 210. The packet error information 264 may indicate a number or percentage of data packets 234 that were successfully received at the device 260 in relation to a number of data packets 234 that were actually requested in the packet request 262. In other words, the packet error information 264 may indicate current network conditions and whether a high percentage of data packets 234 are being successfully received at the device 260. The device 260 may transmit the packet error information 264 along with a subsequent data packet request to the server 210. The packet loss prediction module 214 may use the packet error information 264 to determine whether the predicted number of packets that was previously computed is accurate, or whether that number should be adjusted in view of the packet error information 264. For example, the previous prediction of lost data packets 234 may be increased, decreased or maintained based on the packet error information 264.

In one configuration, the server 210 may receive an instruction from a user computing device 255 to activate or deactivate a setting or feature that causes the server 210 to determine the predicted number of data packets 234 that are expected to be lost and send the parity packets 236 in anticipation of the lost data packets 234. For example, certain devices 260 may not have the computational power to execute error correction codes, perform LDPC decoding, etc. to rebuild lost data packets 234. In this case, a user associated with the user computing device 255 may select an option to deactivate such a setting. The user may be an operator or an administrator that wishes to activate or deactivate the setting. In another example, the server 210 may receive instructions from the user computing device 255 to turn on or turn off the setting depending on an objective of the user associated with the device 260. For example, the user may wish to initially not activate the feature to save battery power at the device, but after a few days have gone by and a particular file 232 has not completely downloaded to the device 260 because of intermittent connectivity issues, the user may activate the feature of this technology to download the file 232 in a reduced amount of time.

In one configuration, the server 210 may automatically activate the feature that causes the server 210 to determine the predicted number of data packets 234 that are expected to be lost and proactively send the parity packets 236 when a connectivity level for the device 260 falls below a defined threshold. For example, the server 210 may detect when a bitrate or data transfer rate for the device 260 is below a defined threshold, or when a number of connection interruptions between the server 210 and the device 260 exceed a certain threshold over a defined time period. In this case, the server 210 may automatically activate this feature and proactively send the parity packets 236 to the device 260.

In one configuration, prior to the device 260 sending the packet request 262 to the server 210, the server 210 may transmit parity packets 236 to the device 260. The device 260 may receive the parity packets 236 and store the parity packets 236 in a data store of the device 260. The device 260 may later use the parity packets 236 to recover requested data packets 234 that are lost during transmission to the device 260. For example, the server 210 may preemptively send 50 parity packets to the device 260. At a later time, if the device 260 sends a packet request 262 for ten data packets and two of those data packets are lost during transmission, the device 260 may use two of the 50 stored parity packets to rebuild the two lost parity packets.

The user computing device 255 may comprise, for example, a processor-based system. The user computing device 255 may be devices such as, but not limited to, desktop computers, laptops or notebook computers, tablet computers, mobile devices, mainframe computer systems, handheld computers, workstations, network computers, or other devices with like capability.

The devices 260 (e.g., IoT devices) may be, for example, processor-based systems or embedded systems. As non-limiting examples, the devices 260 may include consumer products (e.g., rice cookers, televisions, printers, or scanners), home automation products (e.g., smart thermostats, smart refrigerators, heating, air conditioning, etc.), manufacturing devices, farming devices, factory devices, industrial metal stamping devices, industrial robots, sensors, drones, or other devices that are assigned unique identifiers and are capable of communicating data over the network 250. Commercial devices may also be included in the definition of the device 260, including: commercial printing presses, commercial freezers, commercial kilns, commercial mixers or other commercial equipment. The devices 260 may be other types of embedded devices that provide electronic controls for a machine or system.

In one configuration, the device 260 may be a computing hub that receives and transmits data packets 234 to a plurality of IoT devices (e.g., sensors) over a local wireless network. In this example, the IoT devices may not have the processing capabilities to rebuild lost data packets 234, so the computing hub may execute the error correction codes to recover the lost data packets 234 and then forward those data packets 234 to the IoT devices.

The various processes and/or other functionality contained within the service provider environment 200 may be executed on one or more processors that are in communication with one or more memory modules. The service provider environment 200 may include a number of computing devices that are arranged, for example, in one or more server banks or computer banks or other arrangements. The computing devices may support a computing environment using hypervisors, virtual machine managers (VMMs) and other virtualization software.

The term "data store" may refer to any device or combination of devices capable of storing, accessing, organizing and/or retrieving data, which may include any combination and number of data servers, relational databases, object oriented databases, cluster storage systems, data storage devices, data warehouses, flat files and data storage configuration in any centralized, distributed, or clustered environment. The storage system components of the data store may include storage systems such as a SAN (Storage Area Network), cloud storage network, volatile or non-volatile RAM, optical media, or hard-drive type media. The data store may be representative of a plurality of data stores as can be appreciated.

The network 250 may include any useful computing network, including an intranet, the Internet, a localized network, a wide area network, a wireless data network, or any other such network or combination thereof. Components utilized for such a system may depend at least in part upon the type of network and/or environment selected. Communication over the network may be enabled by wired or wireless connections and combinations thereof.

FIG. 2 illustrates that certain processing modules may be discussed in connection with this technology and these processing modules may be implemented as computing services. In one example configuration, a module may be considered a service with one or more processes executing on a server or other computer hardware. Such services may be centrally hosted functionality or a service application that may receive requests and provide output to other services or consumer devices. For example, modules providing services may be considered on-demand computing that are hosted in a server, virtualized service environment, grid or cluster computing system. An application programming interface (API) may be provided for each module to enable a second module to send requests to and receive output from the first module. Such APIs may also allow third parties to interface with the module and make requests and receive output from the modules. While FIG. 2 illustrates an example of a system that may implement the techniques above, many other similar or different environments are possible. The example environments discussed and illustrated above are merely representative and not limiting.

Figure 3:
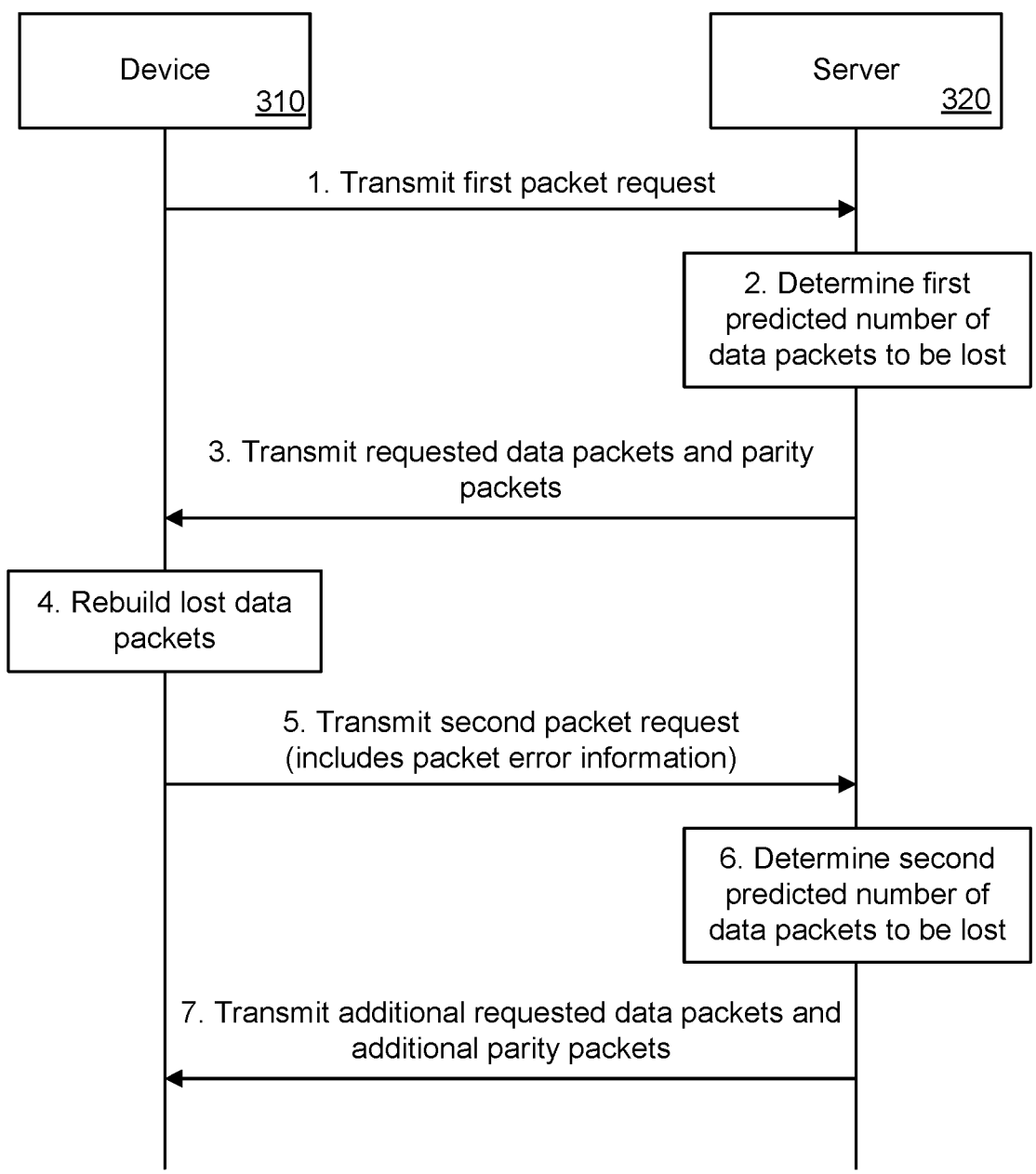
FIG. 3 is a sequence diagram illustrating operations for sending requested data packets and parity packets to a device based on a predicted number of data packets that are expected to be lost during transmission from a server to the device according to an example of the present technology.

FIG. 3 is a sequence chart illustrating an example of operations for sending requested data packets and parity packets to a device 310 based on data packets that are expected to be lost during transmission from a server 320 to the device 310. In a first action, the device 310 may transmit a first packet request to the server 320. In a second action, the server 320 may determine a first predicted number of data packets that are expected to be lost during fulfillment of the first request based on a device profile (e.g., device hardware features, geographic location of device, etc.) In a third action, the server 320 may transmit the requested data packets along with parity packets to the device 310. The number of parity packets may depend on the first predicted number of data packets. In a fourth action, the device 310 may rebuild data packets that were lost during fulfillment of the first request using the parity packets. In a fifth action, the device 310 may transmit a second request for data packets to the server 320. The second request may include packet error information for the requested data packets in the first request. In other words, the second request may indicate how many of the data packets were actually received in response to the first packet request.

In a sixth action, the server 320 may determine a second predicted number of data packets that are expected to be lost during fulfillment of the second request. For example, the server 320 may modify the first predicted number of data packets based on the packet error information. In one example, the server 320 may increase the first predicted number of data packets to arrive at the second predicted number of data packets when the packet error information indicates an actual error value for the requested data packets in the first request is greater than the first predicted number of data packets. In another example, the server 320 may decrease the first predicted number of data packets to arrive at the second predicted number of data packets when the packet error information indicates the actual error value for the requested data packets in the first request is less than the first predicted number of data packets. In yet another example, the server 320 may maintain the first predicted number of data packets when the packet error information indicates the actual error value for the requested data packets in the first request is substantially equal to the first predicted number of data packets. Therefore, the server 320 may dynamically adjust the predicted number of packets in real-time based on the packet error information received from the device 310.

In a seventh action, the server 320 may transmit additional requested data packets to the device 310 and additional parity packets in response to the second packet request. The number of additional parity packets may be based on the second predicted number of data packets.

Figure 4:
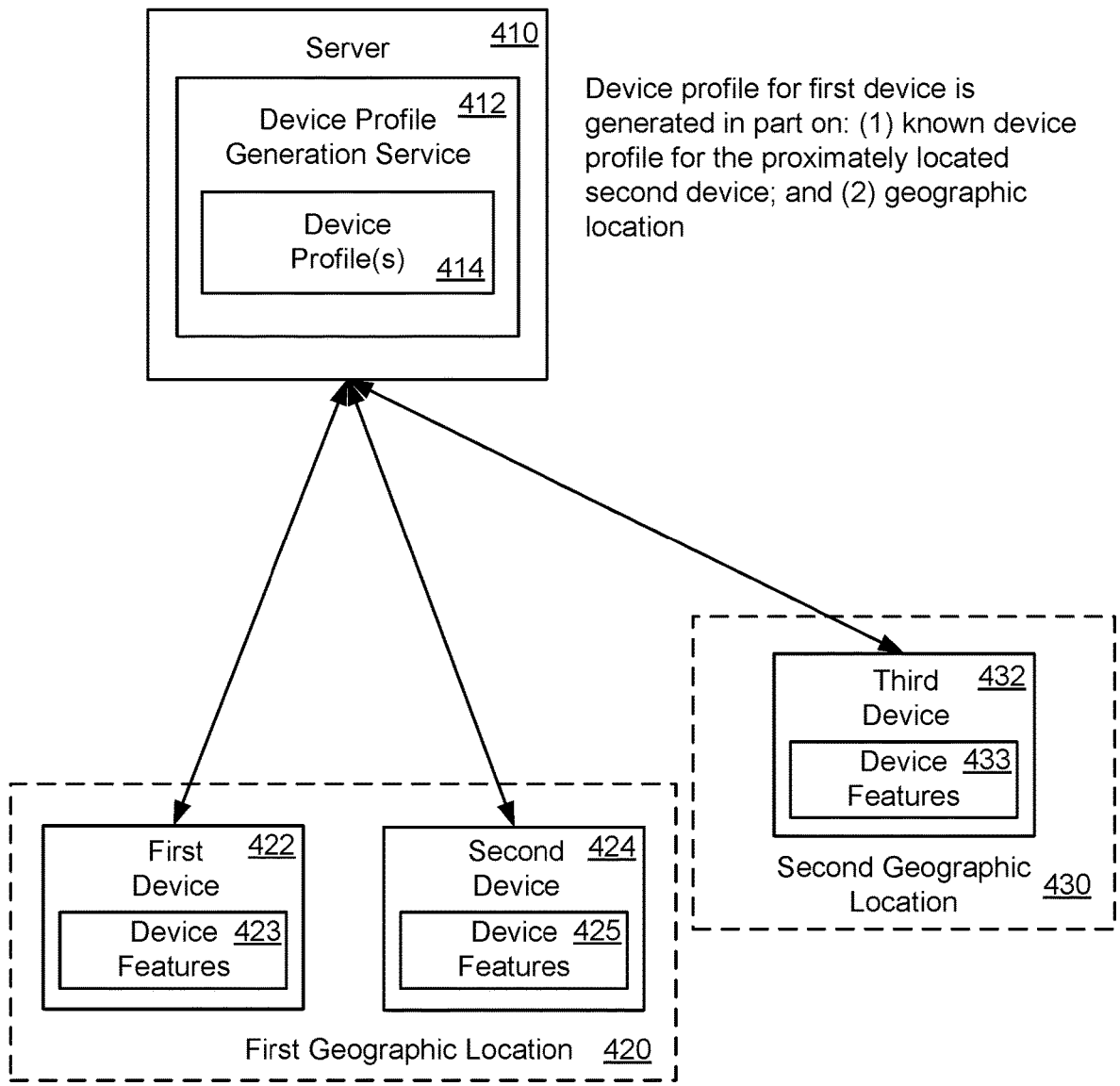
FIG. 4 illustrates a system and related operations for creating a device profile for a device according to an example of the present technology.

FIG. 4 illustrates an example of a system and related operations for creating device profiles 414 for devices. A server 410 may include a device profile generation service 412 to create the device profiles 414. For example, the device profile generation service 412 may have previously created a device profile 414 for a first device 422 based on device features 423 (e.g., memory features, processor features, battery features, etc.) of the first device 422 and a first geographic location 420 associated with the first device 422, where the device profile 414 for the first device 422 may include data transfer rates and levels of connectivity.

At a later time, the device profile generation service 412 may be instructed to generate a device profile 414 for a second device 424 in physical proximity to the first device 422. For example, the second device 424 may be in the same first geographic location 420 as the first device 422. In this case, the device profile generation service 412 may infer certain characteristics for the second device 424 based on its physical proximity to the first device 422 (e.g., favorable connectivity and data transfer rates at the first geographic location 420). Thus, the device profile generation service 412 may generate a device profile 414 for the second device 424 using device features 425 of the second device 424 and the inferred characteristics based on the physical proximity to the first device 422.

As another example, the device profile generation service 412 may generate a device profile 414 for a third device 432 using device features 433 of the third device 432 and a known level of connectivity for a second geographic location 430 in which the third device 432 is located. For example, if the second geographic location 430 is known to be prone to connectivity issues, the device profile generation service 412 may generate a device profile 414 for the third device 432 based on such location information, as well as device features 433 of the third device 432.

FIG. 5 is an example of an illustration of an adjustment to a number of requested data packets and parity packets that are sent over a period of time based on packet error information. At a first time point (Time0), a device may send a first packet request for 10 data packets, and in response, a server may send 10 data packets and two parity packets based on a device profile. The device may successfully receive all 10 data packets.

At a second time point (Time1), the device may send a second packet request for 10 data packets. The second packet request may include packet error information related to fulfillment of the first request. In this case, the packet error information may indicate that no data packets were lost in response to the first packet request. After receiving the second request, the server may send 10 data packets and one parity packet based on the received packet error information. In other words, since the packet error information indicated that no data packets were lost, the server may send one less parity packet to the device. In this case, the device may receive 9 data packets and may rebuild one lost data packet using one parity packet.

At a third time point (Time2), the device may send a third packet request for 10 data packets. The third packet request may include packet error information related to fulfillment of the second request. In this example, the packet error information may indicate that one data packet was lost during fulfillment of the second request. After receiving the third request, the server may send 10 data packets and two parity packets based on the received packet error information. In other words, since the packet error information indicated that one data packet was lost, the server may increase the number of parity packets that are sent to the device. In this case, the device may receive 7 data packets and may rebuild two lost data packets using the two parity packets. However, the device may not have a sufficient number of parity packets to rebuild all of the lost data packets, so one data packet may not be rebuilt by the device. The device may enter a timeout period (e.g., 16 seconds) during which the device may be prevented from sending another packet request.

At a fourth time point (Time3), the device may send a fourth packet request for 10 data packets. The device may send the fourth packet request after expiry of the timeout period. The fourth packet request may include packet error information related to fulfillment of the third request. In this example, the packet error information may indicate that three data packets were lost during fulfillment of the third request. After receiving the fourth request, the server may send 10 data packets and three parity packets based on the received packet error information.

In the example shown in FIG. 5, the server may dynamically increase, decrease or maintain the number of parity packets that are sent to the device based on the packet error information received from the device. Therefore, after each packet request, the server may adjust or modify the number of parity packets that are sent based on an actual number of data packets that are being lost at the device.

Figure 6:
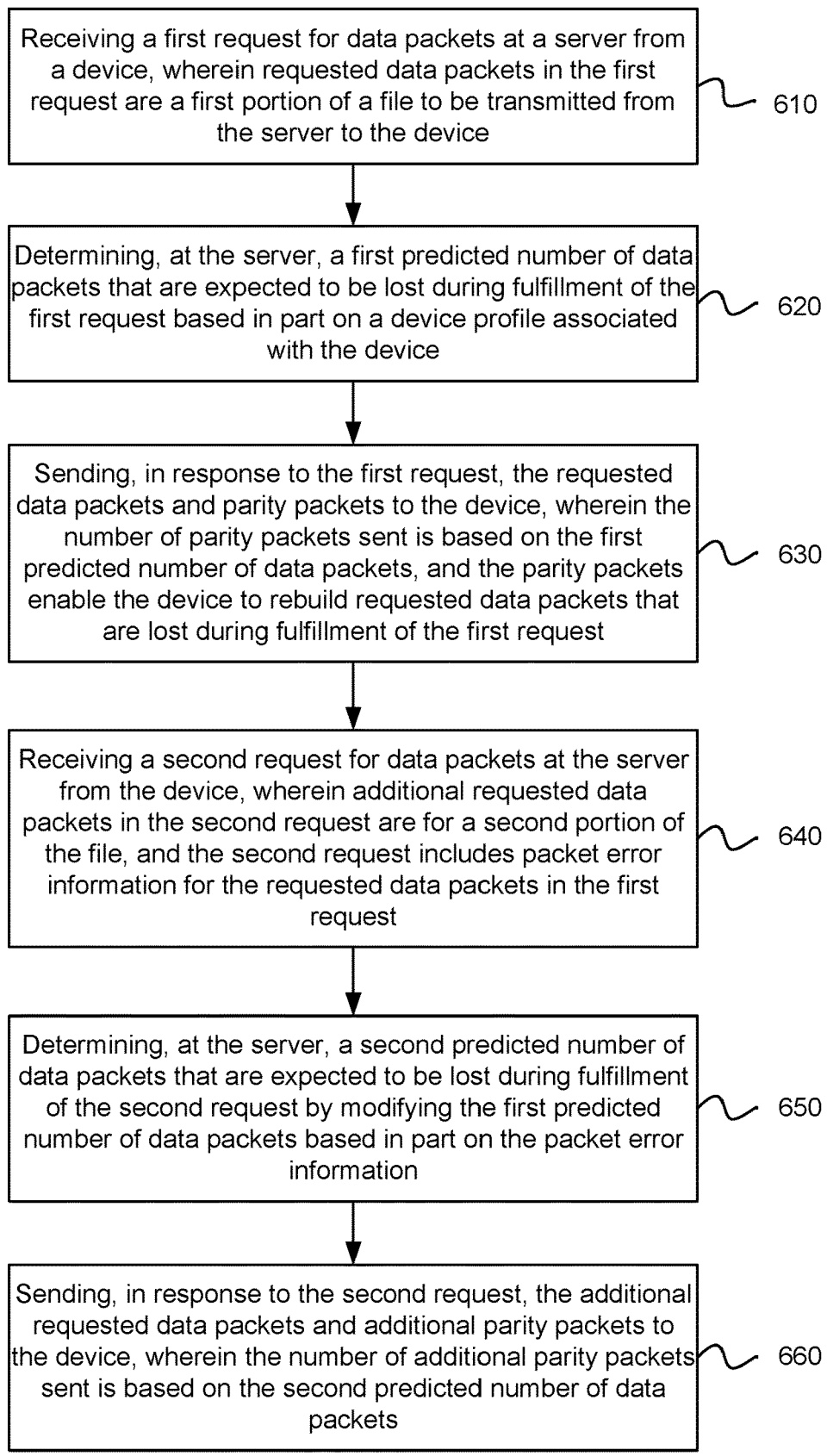
FIG. 6 is a flowchart of an example method for receiving data packet requests at a server and sending the requested data packets and parity packets from the server to a device.

FIG. 6 illustrates an example of a method for receiving data packet requests at a server and sending the requested data packets and parity packets from the server to a device. A first request for data packets may be received at the server from the device, as in block 610. Requested data packets in the first request may be for a first portion of a file to be downloaded from the server to the device. The file may be downloaded as part of an OTA update for the device, which may be an IoT device.

A first predicted number of data packets that are expected to be lost during fulfillment of the first request may be determined at the server based in part on a device profile associated with the device, as in block 620. The device profile may include a device type, a memory type for the device, a processor type for the device, a current battery level for the device, an indicator of whether the device is plugged into a power source, a geographic location of the device and a level of connectivity associated with the geographic location, a type of network connection used by the device, a historical percentage of lost data packets per request and/or packet loss information for devices located in physical proximity to the device.

The requested data packets and parity packets may be sent, in response to the first request, to the device based on the first predicted number of data packets expected to be lost, as in block 630. The parity packets may enable the device to rebuild requested data packets that are lost during fulfillment of the first request. For example, the device may rebuild lost data packets using parity packets based on LDPC decoding executed at the device.

A second request for data packets may be received at the server from the device, as in block 640. Additional requested data packets in the second request may be for a second portion of the file. The second request may include packet error information for the requested data packets in the first request. For example, the packet error information may indicate a percentage of the requested data packets that were successfully received at the device in response to the first request.

A second predicted number of data packets that are expected to be lost during fulfillment of the second request may be determined at the server by modifying the first predicted number of data packets based in part on the packet error information, as in block 650. In one example, the number of additional parity packets sent in response to the second request may be greater than the number of parity packets sent in response to the first request when the packet error information indicates an actual number of lost data packets corresponding to the first request is greater than the first predicted number of data packets. In another example, the number of additional parity packets sent in response to the second request may be less than the number of parity packets sent in response to the first request when the packet error information indicates the actual number of lost data packets corresponding to the first request is less than the first predicted number of data packets. In yet another example, the number of additional parity packets sent in response to the second request is substantially equal to the number of parity packets sent in response to the first request when the packet error information indicates the actual number of lost data packets corresponding to the first request is substantially equal to the first predicted number of data packets.

The additional requested data packets and additional parity packets may be sent to the device in response to the second request, as in block 660. The number of additional parity packets sent may be based on the second predicted number of data packets. The device may receive the additional requested data packets and use the additional parity packets to rebuild any additional requested data packets that were not received from the server.

Figure 7:
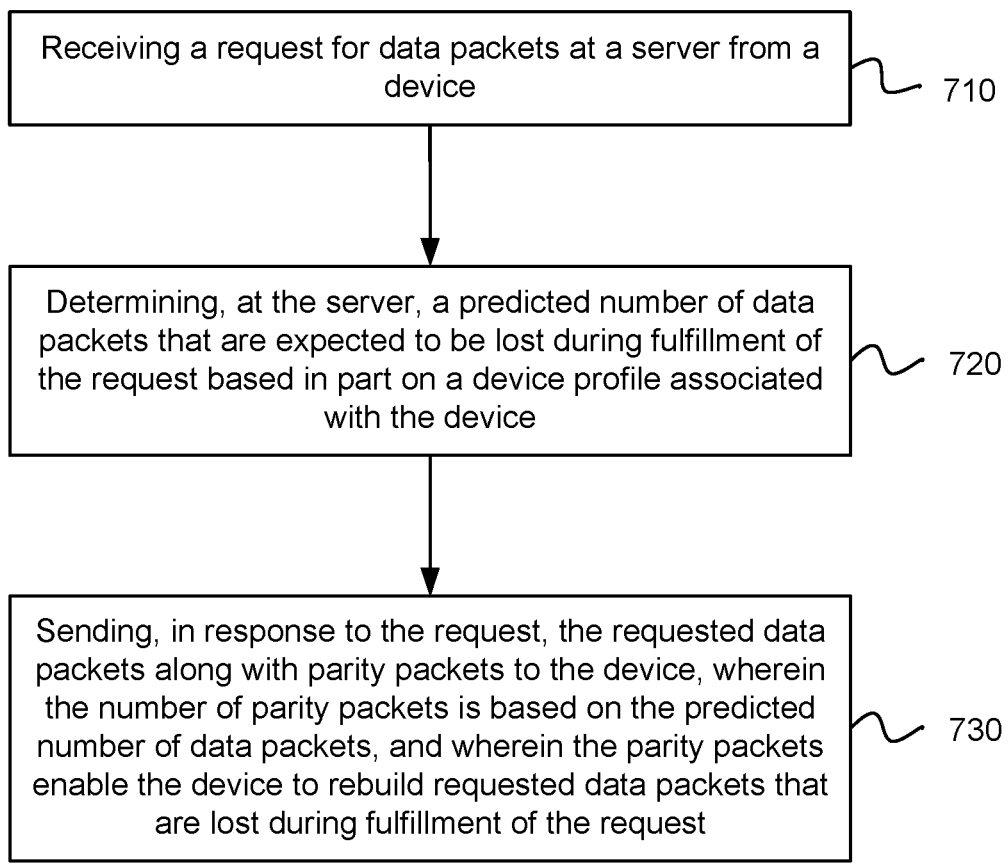
FIG. 7 is a flowchart of an example method for receiving data packet requests at a server and sending the requested data packets and parity packets from the server to a device.

FIG. 7 illustrates an example of a method for receiving data packet requests at a server and sending the requested data packets and parity packets from the server to a device. A request for data packets may be received at the server from the device, as in block 710. For example, the device may be an IoT device, and the requested data packets may be part of a file to be downloaded as an OTA update from the server in an update service to the device operating in a service provider environment.

A predicted number of data packets that are expected to be lost during fulfillment of the request (i.e., when the data packets are sent across the network) may be determined at the server based in part on a device profile associated with the device, as in block 720. Further, elements of the device profile may be provided as inputs or input features to a machine learning model, and the number of data packets predicted to be lost may be determined based on an output from the machine learning model.

The requested data packets and parity packets may be sent, in response to the request, to the device, as in block 730. As a non-limiting example, the request from the device may be for ten data packets, and in response, the server may send ten data packets to the device. The number of parity packets may be based on the predicted number of data packets, where the parity packets may enable the device to rebuild requested data packets that are lost during fulfillment of the request. The parity packets may contain bits used as low-density parity-check (LDPC) codes at the device to rebuild the requested data packets that are lost during fulfillment of the request.

Figure 8:
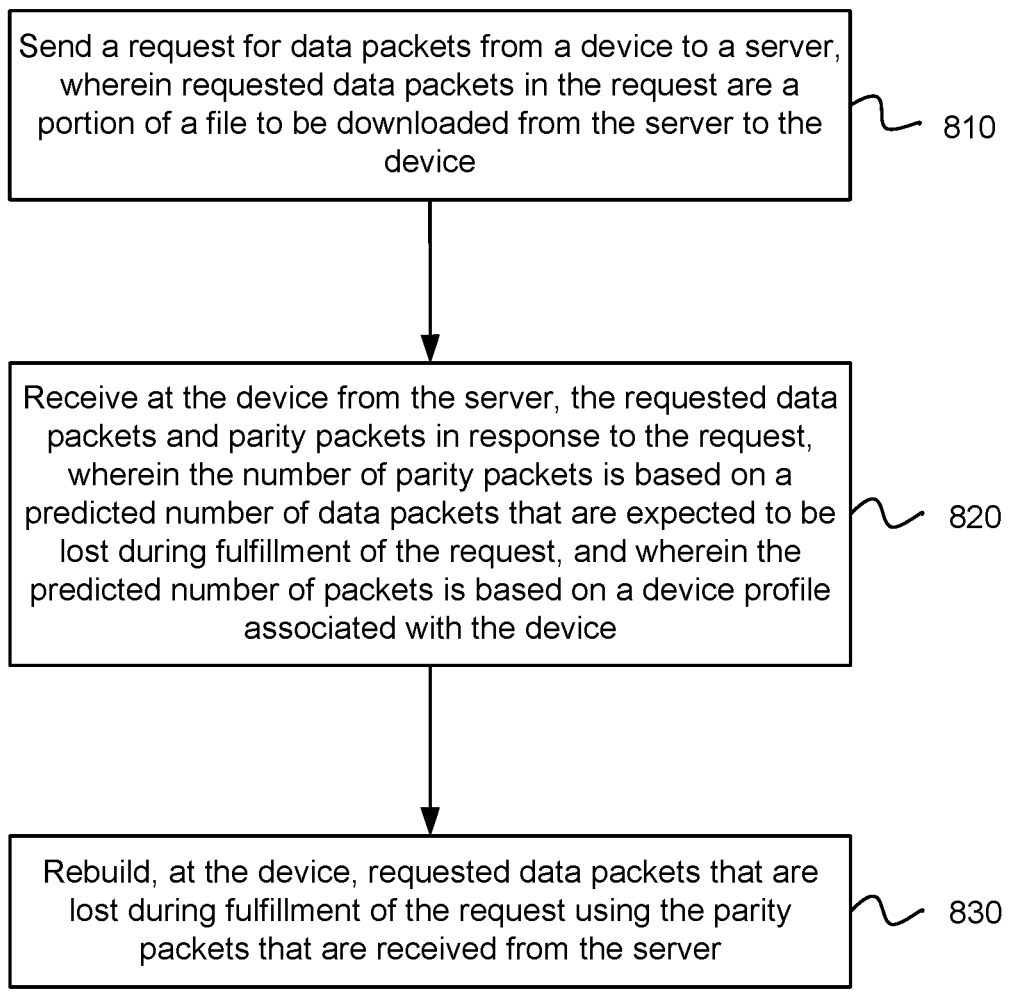
FIG. 8 is a flowchart of an example method for receiving requested data packets and parity packets at a device and rebuilding lost data packets using the parity packets.

FIG. 8 illustrates an example of a method for receiving requested data packets and parity packets at a device and rebuilding lost data packets using the parity packets. A request for data packets may be sent from the device to the server, as in block 810. Requested data packets in the request may be a portion of a file to be downloaded from the server to the device. The requested packets and parity packets may be received at the device, from the server, in response to the request, as in block 820. The number of parity packets received may be based on a predicted number of data packets that are expected to be lost during fulfillment of the request, where the predicted number of data packets may be based on a device profile.

Requested data packets that are lost during fulfillment of the request may be rebuilt at the device using the parity packets that are received from the server, as in block 830. In one example, the device may rebuild the requested data packets that are lost immediately after the request is fulfilled by the server or after a plurality of separate requests are fulfilled by the server. In another example, the device may rebuild one lost data packet using one parity packet based on low-density parity-check (LDPC) decoding executed at the device.

In one example, the device may send a subsequent request for data packets to the server. The subsequent request may include packet error information for the requested data packets in the request previously made by the device. The device may receive requested data packets at the device in response to the subsequent request. The device may receive a different number of parity packets at the device based on a modified predicted number of data packets, where the modified predicted number of data packets may account for the packet error information reported by the device. The device may rebuild data packets that are lost during fulfillment of the subsequent request using the parity packets that are received from the server.

In one example, the device may determine that an actual number of data packets that are lost is greater than the parity packets received from the server. The device may wait for a timeout period to expire. The device may send a subsequent request for data packets to the server after expiry of the timeout period, where the subsequent request may include packet error information indicating that the actual number of data packets that was lost exceeded the parity packets to enable the server to adjust the predicted number of data packets that are expected to be lost.

Figure 9:
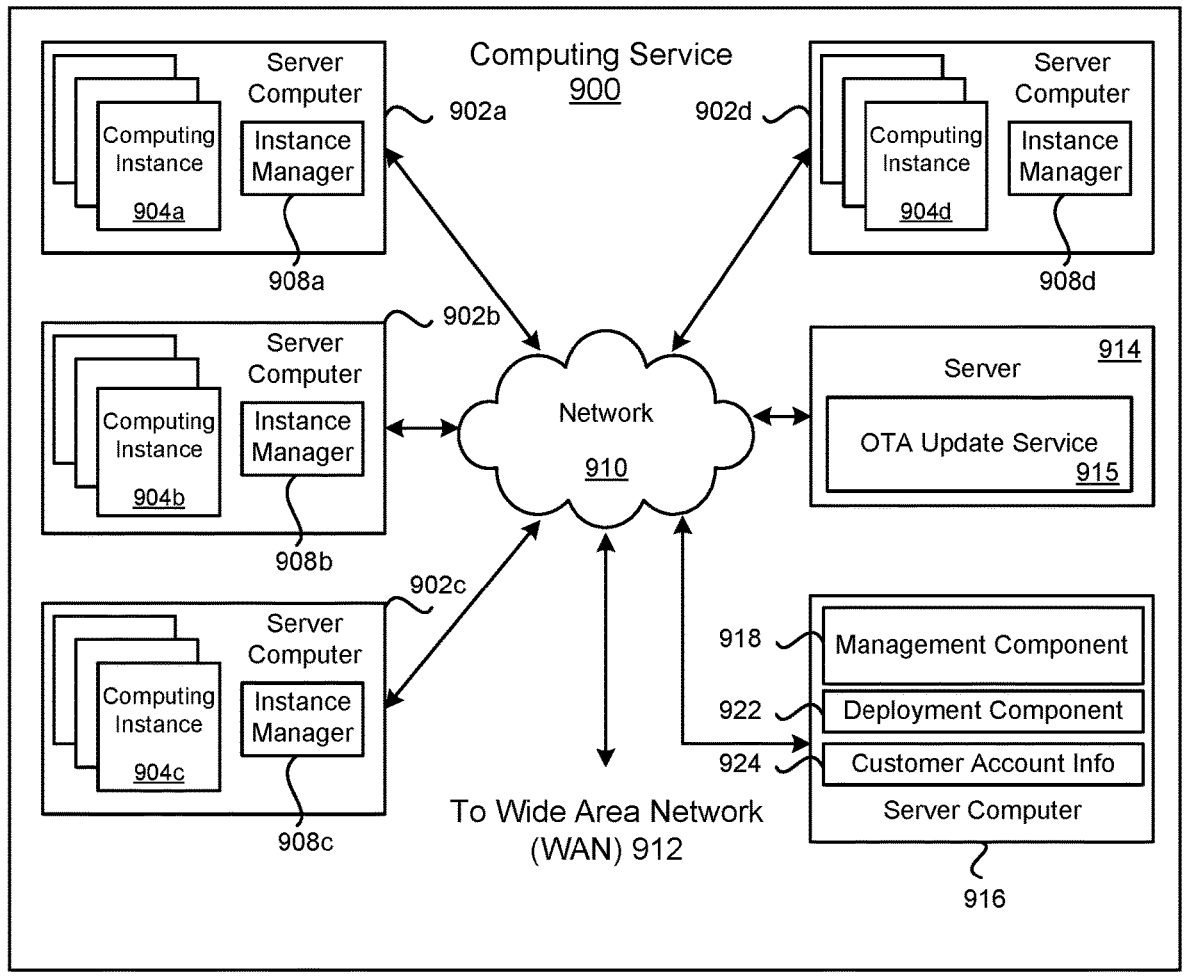
FIG. 9 is a block diagram of a service provider environment according to an example of the present technology.

FIG. 9 is a block diagram illustrating an example computing service 900 that may be used to execute and manage a number of computing instances 904a-d upon which the present technology may execute. In particular, the computing service 900 depicted illustrates one environment in which the technology described herein may be used. The computing service 900 may be one type of environment that includes various virtualized service resources that may be used, for instance, to host computing instances 904a-d.

The computing service 900 may be capable of delivery of computing, storage and networking capacity as a software service to a community of end recipients. In one example, the computing service 900 may be established for an organization by or on behalf of the organization. That is, the computing service 900 may offer a "private cloud environment." In another example, the computing service 900 may support a multi-tenant environment, wherein a plurality of customers may operate independently (i.e., a public cloud environment). Generally speaking, the computing service 900 may provide the following models: Infrastructure as a Service ("IaaS") and/or Software as a Service ("SaaS"). Other models may be provided. For the IaaS model, the computing service 900 may offer computers as physical or virtual machines and other resources. The virtual machines may be run as guests by a hypervisor, as described further below. The PaaS model delivers a computing system that may include an operating system, programming language execution environment, database, and web server.

Application developers may develop and run their software solutions on the computing service system without incurring the cost of buying and managing the underlying hardware and software. The SaaS model allows installation and operation of application software in the computing service 900. End customers may access the computing service 900 using networked client devices, such as desktop computers, laptops, tablets, smartphones, etc. running web browsers or other lightweight client applications, for example. Those familiar with the art will recognize that the computing service 900 may be described as a "cloud" environment.

The particularly illustrated computing service 900 may include a plurality of server computers 902a-d. The server computers 902a-d may also be known as physical hosts. While four server computers are shown, any number may be used, and large data centers may include thousands of server computers. The computing service 900 may provide computing resources for executing computing instances 904a-d. Computing instances 904a-d may, for example, be virtual machines. A virtual machine may be an instance of a software implementation of a machine (i.e. a computer) that executes applications like a physical machine. In the example of a virtual machine, each of the server computers 902a-d may be configured to execute an instance manager 908a-d capable of executing the instances. The instance manager 908a-d may be a hypervisor, virtual machine manager (VMM), or another type of program configured to enable the execution of multiple computing instances 904a-d on a single server. Additionally, each of the computing instances 904a-d may be configured to execute one or more applications.

A server 914 may be reserved to execute software components for implementing the present technology or managing the operation of the computing service 900 and the computing instances 904a-d. For example, the server 914 may include an OTA update service 915 that receives a request for packets from a device. The OTA update service 915 may determine a predicted number of packets that are expected to be lost during fulfillment of the request based in part on a device profile. The OTA update service 915 may send, in response to the request, the requested packets and parity packets to the device, where the parity packets may be based on the predicted number of packets. The parity packets may enable the device to rebuild requested packets that are lost during fulfillment of the request.

A server computer 916 may execute a management component 918. A customer may access the management component 918 to configure various aspects of the operation of the computing instances 904a-d purchased by a customer. For example, the customer may setup computing instances 904a-d and make changes to the configuration of the computing instances 904a-d.

A deployment component 922 may be used to assist customers in the deployment of computing instances 904a-d. The deployment component 922 may have access to account information associated with the computing instances 904a-d, such as the name of an owner of the account, credit card information, country of the owner, etc. The deployment component 922 may receive a configuration from a customer that includes data describing how computing instances 904a-d may be configured. For example, the configuration may include an operating system, provide one or more applications to be installed in computing instances 904*a-d*, provide scripts and/or other types of code to be executed for configuring computing instances 904*a-d*, provide cache logic specifying how an application cache is to be prepared, and other types of information. The deployment component 922 may utilize the customer-provided configuration and cache logic to configure, prime, and launch computing instances 904*a-d*. The configuration, cache logic, and other information may be specified by a customer accessing the management component 918 or by providing this information directly to the deployment component 922.

Customer account information 924 may include any desired information associated with a customer of the multi-tenant environment. For example, the customer account information may include a unique identifier for a customer, a customer address, billing information, licensing information, customization parameters for launching instances, scheduling information, etc. As described above, the customer account information 924 may also include security information used in encryption of asynchronous responses to API requests. By "asynchronous" it is meant that the API response may be made at any time after the initial request and with a different network connection.

A network 910 may be utilized to interconnect the computing service 900 and the server computers 902*a-d*, 916. The network 910 may be a local area network (LAN) and may be connected to a Wide Area Network (WAN) 912 or the Internet, so that end customers may access the computing service 900. In addition, the network 910 may include a virtual network overlaid on the physical network to provide communications between the servers 902*a-d*. The network topology illustrated in FIG. 9 has been simplified, as many more networks and networking devices may be utilized to interconnect the various computing systems disclosed herein.

Figure 10:
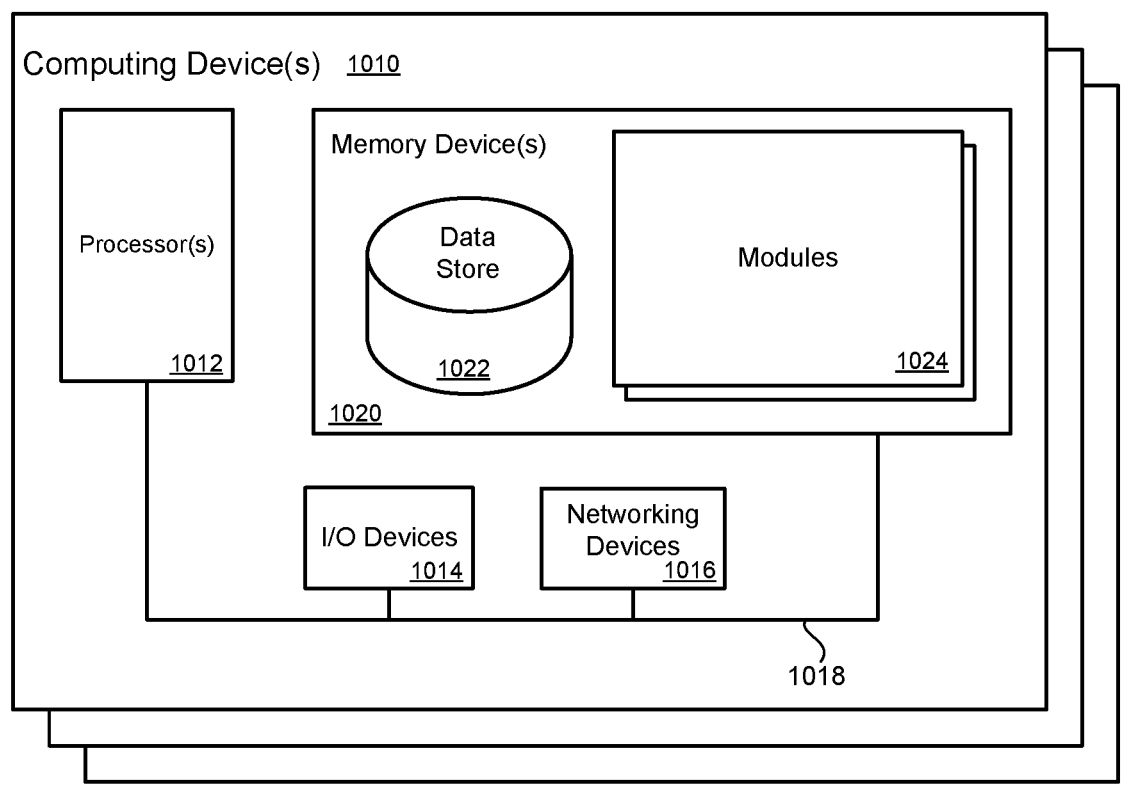
FIG. 10 is a block diagram that provides an example illustration of a computing device that may be employed in the present technology.

FIG. 10 illustrates a computing device 1010 on which modules of this technology may execute. The computing device 1010 is illustrated on which a high level example of the technology may be executed. The computing device 1010 may include one or more processors 1012 that are in communication with memory devices 1020. The computing device may include a local communication interface 1018 for the components in the computing device. For example, the local communication interface may be a local data bus and/or any related address or control busses as may be desired.

The memory device 1020 may contain modules 1024 that are executable by the processor(s) 1012 and data for the modules 1024. The modules 1024 may execute the functions described earlier. A data store 1022 may also be located in the memory device 1020 for storing data related to the modules 1024 and other applications along with an operating system that is executable by the processor(s) 1012.

Other applications may also be stored in the memory device 1020 and may be executable by the processor(s) 1012. Components or modules discussed in this description that may be implemented in the form of software using high programming level languages that are compiled, interpreted or executed using a hybrid of the methods.

The computing device may also have access to I/O (input/output) devices 1014 that are usable by the computing devices. An example of an I/O device is a display screen that is available to display output from the computing devices. Other known I/O device may be used with the computing device as desired. Networking devices 1016 and similar communication devices may be included in the computing device. The networking devices 1016 may be wired or wireless networking devices that connect to the internet, a LAN, WAN, or other computing network.

The components or modules that are shown as being stored in the memory device 1020 may be executed by the processor 1012. The term "executable" may mean a program file that is in a form that may be executed by a processor 1012. For example, a program in a higher level language may be compiled into machine code in a format that may be loaded into a random access portion of the memory device 1020 and executed by the processor 1012, or source code may be loaded by another executable program and interpreted to generate instructions in a random access portion of the memory to be executed by a processor. The executable program may be stored in any portion or component of the memory device 1020. For example, the memory device 1020 may be random access memory (RAM), read only memory (ROM), flash memory, a solid state drive, memory card, a hard drive, optical disk, floppy disk, magnetic tape, or any other memory components.

The processor 1012 may represent multiple processors and the memory 1020 may represent multiple memory units that operate in parallel to the processing circuits. This may provide parallel processing channels for the processes and data in the system. The local interface 1018 may be used as a network to facilitate communication between any of the multiple processors and multiple memories. The local interface 1018 may use additional systems designed for coordinating communication such as load balancing, bulk data transfer, and similar systems.

While the flowcharts presented for this technology may imply a specific order of execution, the order of execution may differ from what is illustrated. For example, the order of two more blocks may be rearranged relative to the order shown. Further, two or more blocks shown in succession may be executed in parallel or with partial parallelization. In some configurations, one or more blocks shown in the flow chart may be omitted or skipped. Any number of counters, state variables, warning semaphores, or messages might be added to the logical flow for purposes of enhanced utility, accounting, performance, measurement, troubleshooting or for similar reasons.

Some of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more blocks of computer instructions, which may be organized as an object, procedure, or function. Nevertheless, the executables of an identified module need not be physically located together, but may comprise disparate instructions stored in different locations which comprise the module and achieve the stated purpose for the module when joined logically together.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices. The modules may be passive or active, including agents operable to perform desired functions.

The technology described here can also be stored on a computer readable storage medium that includes volatile and non-volatile, removable and non-removable media implemented with any technology for the storage of information such as computer readable instructions, data structures, program modules, or other data. Computer readable storage media include, but is not limited to, RAM, ROM, EEPROM, flash memory or other memory technology, CD-ROM, digital versatile disks (DVD) or other optical storage, magnetic cassettes, magnetic tapes, magnetic disk storage or other magnetic storage devices, or any other computer storage medium which can be used to store the desired information and described technology.

The devices described herein may also contain communication connections or networking apparatus and networking connections that allow the devices to communicate with other devices. Communication connections are an example of communication media. Communication media typically embodies computer readable instructions, data structures, program modules and other data in a modulated data signal such as a carrier wave or other transport mechanism and includes any information delivery media. A "modulated data signal" means a signal that has one or more of its characteristics set or changed in such a manner as to encode information in the signal. By way of example, and not limitation, communication media includes wired media such as a wired network or direct-wired connection, and wireless media such as acoustic, radio frequency, infrared, and other wireless media. The term computer readable media as used herein includes communication media.

Reference was made to the examples illustrated in the drawings, and specific language was used herein to describe the same. It will nevertheless be understood that no limitation of the scope of the technology is thereby intended. Alterations and further modifications of the features illustrated herein, and additional applications of the examples as illustrated herein, which would occur to one skilled in the relevant art and having possession of this disclosure, are to be considered within the scope of the description.

Furthermore, the described features, structures, or characteristics may be combined in any suitable manner in one or more examples. In the preceding description, numerous specific details were provided, such as examples of various configurations to provide a thorough understanding of examples of the described technology. One skilled in the relevant art will recognize, however, that the technology can be practiced without one or more of the specific details, or with other methods, components, devices, etc. In other instances, well-known structures or operations are not shown or described in detail to avoid obscuring aspects of the technology.

Although the subject matter has been described in language specific to structural features and/or operations, it is to be understood that the subject matter defined in the appended claims is not necessarily limited to the specific features and operations described above. Rather, the specific features and acts described above are disclosed as example forms of implementing the claims. Numerous modifications and alternative arrangements can be devised without departing from the spirit and scope of the described technology.

What is claimed is:

1. A non-transitory machine readable storage medium having instructions embodied thereon, the instructions when executed by one or more processors, cause the one or more processors to perform a process including:
   receiving a first request for first data packets at a server from a device;
   determining, at the server, a first predicted number of data packets that are expected to be lost during fulfillment of the first request based in part on a device profile associated with the device;
   sending, in response to the first request, the first data packets and a first set of parity packets to the device, wherein a number of parity packets in the first set of parity packets is based on the first predicted number of data packets, and the parity packets enable the device to rebuild data packets that are lost during fulfillment of the first request;
   receiving a second request for second data packets at the server from the device, wherein the second request includes packet error information that indicates an actual number of lost data packets corresponding to the first request;
   determining, at the server, a second predicted number of data packets that are expected to be lost during fulfillment of the second request based in part on the packet error information; and
   sending, in response to the second request, the second data packets and a second set of parity packets to the device, wherein a number of parity packets in the second set of parity packets is based on the second predicted number of data packets.

2. The non-transitory machine readable storage medium of claim 1, wherein:
   the number of parity packets in the second set of parity packets is greater than the number of parity packets in the first set of parity packets when the packet error information indicates the actual number of lost data packets corresponding to the first request is greater than the first predicted number of data packets;
   the number of parity packets in the second set of parity packets is less than the number of parity packets in the first set of parity packets when the packet error information indicates the actual number of lost data packets corresponding to the first request is less than the first predicted number of data packets; or
   the number of parity packets in the second set of parity packets is substantially equal to the number of parity packets in the first set of parity packets when the packet error information indicates the actual number of lost data packets corresponding to the first request is substantially equal to the first predicted number of data packets.

3. The non-transitory machine readable storage medium of claim 1, wherein the device profile includes at least one of: a device type, a memory type for the device, a processor type for the device, a current battery level for the device, an indicator of whether the device is plugged into a power source, a geographic location of the device and a level of connectivity associated with the geographic location, a type of network connection used by the device, a historical percentage of lost data packets per request, or packet loss information for devices located in physical proximity to the device.

4. The non-transitory machine readable storage medium of claim 1, further comprising:
  providing elements of the device profile as inputs to a machine learning model; and
  determining the first predicted number of data packets and the second predicted number of data packets based on an output from the machine learning model.

5. A method, comprising:
  receiving a first request for first data packets at a server from a device;
  determining, at the server, a predicted number of data packets that are expected to be lost during fulfillment of the first request based in part on a device profile associated with the device; and
  sending, in response to the first request, the first data packets along with a first set of parity packets to the device, wherein a number of parity packets in the first set of parity packets is based on the predicted number of data packets, and wherein the parity packets enable the device to rebuild data packets that are lost during fulfillment of the first request.

6. The method of claim 5, further comprising:
  receiving a subsequent request for additional data packets at the server from the device, wherein the subsequent request includes packet error information for the first request;
  determining a modified predicted number of data packets that are expected to be lost in fulfilling the subsequent request based in part on the packet error information; and
  sending, in response to the subsequent request, the additional data packets and a second set of parity packets to the device, wherein the number of parity packets in the second set of parity packets is based on the modified predicted number of data packets.

7. The method of claim 6, wherein:
  the number of parity packets in the second set of parity packets is greater than the number of parity packets in the first set of parity packets when the packet error information indicates an actual number of lost data packets corresponding to the first request is greater than the predicted number of data packets;
  the number of parity packets in the second set of parity packets is less than the number of parity packets in the first set of parity packets when the packet error information indicates the actual number of lost data packets corresponding to the first request is less than the predicted number of data packets; or
  the number of parity packets in the second set of parity packets is substantially equal to the number of parity packets in the first set of parity packets when the packet error information indicates the actual number of lost data packets corresponding to the first request is substantially equal to the predicted number of data packets.

8. The method of claim 5, wherein the device profile includes at least one of: a device type, a memory type for the device, a processor type for the device, a current battery level for the device, an indicator of whether the device is plugged into a power source, a geographic location of the device and a level of connectivity associated with the geographic location, a type of network connection used by the device, a historical percentage of lost data packets per request, or packet loss information for devices located in physical proximity to the device.

9. The method of claim 5, further comprising:
  providing elements of the device profile as inputs to a machine learning model; and
  determining the predicted number of data packets based on an output from the machine learning model.

10. The method of claim 5, further comprising: receiving an instruction from a user device to activate a setting that causes the server to perform the determining of the predicted number of data packets that are expected to be lost and the sending of the first set of parity packets is in anticipation of losing the predicted number of data packets.

11. The method of claim 5, wherein determining the predicted number of data packets that are expected to be lost and sending the first set parity packets to the device is based on a determination that the connectivity level for the device is below a defined threshold.

12. The method of claim 5, wherein the requested data packets are part of a file to be transmitted as an over-the-air (OTA) update from the server to the device via an update service operating in a service provider environment.

13. The method of claim 5, wherein the parity packets correspond with low-density parity-check (LDPC) codes.

14. The method of claim 5, wherein the device is an Internet of Things (IoT) device.

15. A system, comprising:
  at least one processor; and
  at least one memory device including a data store to store a plurality of data and instructions that, when executed, cause the system to:
    send a request for data packets from a device to a server;
    receive, at the device from the server, the requested data packets and parity packets in response to the request, wherein a number of parity packets is based on a predicted number of data packets that are expected to be lost during fulfillment of the request, and wherein the predicted number of packets is based on a device profile associated with the device; and
    rebuild, at the device, requested data packets that are lost during fulfillment of the request using the parity packets that are received from the server.

16. The system of claim 15, wherein the plurality of data and instructions, when executed, cause the system to:
  send a subsequent request for data packets to the server, wherein the subsequent request includes packet error information for the requested data packets in the request previously made by the device;
  receive requested data packets at the device in response to the subsequent request;
  receive parity packets at the device based on a modified predicted number of data packets, wherein the modified predicted number of data packets accounts for the packet error information reported by the device; and
  rebuild, at the device, requested data packets that are lost during fulfillment of the subsequent request using the parity packets that are received from the server.

17. The system of claim 15, wherein the plurality of data and instructions, when executed, cause the system to: rebuild at least one lost data packet using at least one parity packet based on low-density parity-check (LDPC) decoding executed at the device.

18. The system of claim 15, wherein the plurality of data and instructions, when executed, cause the system to: recover the requested data packets that are lost immediately after the request is fulfilled by the server or after a plurality of separate requests are fulfilled by the server.

19. The system of claim 15, wherein the plurality of data and instructions, when executed, cause the system to:
  determine that an actual number of data packets that are lost is greater than the ability to use the parity packets received from the server to rebuild lost packets;

wait for a timeout period to expire; and send a subsequent request for data packets to the server after expiry of the timeout period, wherein the subsequent request includes packet error information indicating that the actual number of data packets that was lost exceeded the parity packets to enable the server to adjust the predicted number of data packets that are expected to be lost.

20. The system of claim 15, wherein the device profile includes at least one of: a device type, a memory type for the device, a processor type for the device, a current battery level for the device, an indicator of whether the device is plugged into a power source, a geographic location of the device and a level of connectivity associated with the geographic location, a type of network connection used by the device, a historical percentage of lost data packets per request, or packet loss information for devices located in physical proximity to the device.

* * * * *